United States Patent
Zhang et al.

(10) Patent No.: US 10,984,994 B2
(45) Date of Patent: Apr. 20, 2021

(54) DEPOSITION APPARATUS AND PHYSICAL VAPOR DEPOSITION CHAMBER

(71) Applicant: BEIJING NAURA MICROELECTRONICS EQUIPMENT CO., LTD, Beijing (CN)

(72) Inventors: Jun Zhang, Beijing (CN); Boyu Dong, Beijing (CN); Jinrong Zhao, Beijing (CN); Xuewei Wu, Beijing (CN); Bingliang Guo, Beijing (CN); Baogang Xu, Beijing (CN); Henan Zhang, Beijing (CN); Tong Wang, Beijing (CN); Shaohui Liu, Beijing (CN); Jun Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 66 days.

(21) Appl. No.: 15/551,493

(22) PCT Filed: Oct. 9, 2016

(86) PCT No.: PCT/CN2016/101565
§ 371 (c)(1),
(2) Date: Aug. 16, 2017

(87) PCT Pub. No.: WO2017/215154
PCT Pub. Date: Dec. 21, 2017

(65) Prior Publication Data
US 2018/0247799 A1 Aug. 30, 2018

(30) Foreign Application Priority Data
Jun. 12, 2016 (CN) .......................... 201610407585.8

(51) Int. Cl.
*H01J 37/34* (2006.01)
*C23C 14/34* (2006.01)
(Continued)

(52) U.S. Cl.
CPC .......... *H01J 37/3488* (2013.01); *C23C 14/34* (2013.01); *C23C 14/566* (2013.01);
(Continued)

(58) Field of Classification Search
CPC ................ C23C 14/34; H01J 37/32559; H01J 37/32733; H01J 37/32899; H01J 37/3426; H01J 37/3488
(Continued)

(56) References Cited

U.S. PATENT DOCUMENTS 5,131,460 A * 7/1992 Krueger ................ C23C 14/541
165/80.2
5,624,536 A * 4/1997 Wada ...................... C23C 14/34
204/192.12
(Continued)

FOREIGN PATENT DOCUMENTS

CN 101542013 A 9/2009
CN 101674893 A 3/2010
(Continued)

OTHER PUBLICATIONS

Machine Translation JP 2011-108603 dated Jun. 2011. (Year: 2011).*
(Continued)

*Primary Examiner* — Rodney G McDonald
(74) *Attorney, Agent, or Firm* — Anova Law Group, PLLC

(57) ABSTRACT

The present disclosure provides a deposition apparatus, including a first chamber, a second chamber and a third chamber. The first chamber is configured to load a substrate. The second chamber is configured to provide a high tem-
(Continued)

perature environment in which a degas process and a sputtering process are performed on the substrate. The third chamber is provided between the first chamber and the second chamber. The third chamber is configured to transfer the substrate from the first chamber to the second chamber via the third chamber.

20 Claims, 9 Drawing Sheets

(51) Int. Cl.
C23C 14/56 (2006.01)
H01J 37/32 (2006.01)

(52) U.S. Cl.
CPC .. *H01J 37/32559* (2013.01); *H01J 37/32733* (2013.01); *H01J 37/32899* (2013.01); *H01J 37/3426* (2013.01)

(58) Field of Classification Search
USPC ........................................ 204/298.11, 298.07
See application file for complete search history.

(56) References Cited

U.S. PATENT DOCUMENTS

| 5,925,227 | A | * | 7/1999 | Kobayashi | ............ C23C 14/568 204/298.07 |
| 6,110,821 | A | | 8/2000 | Kohara et al. | |
| 6,132,805 | A | * | 10/2000 | Moslehi | .................. C23C 14/22 118/720 |
| 2005/0227120 | A1 | | 10/2005 | Ichihara et al. | |
| 2011/0240462 | A1 | * | 10/2011 | Yamazaki | ......... H01J 37/32458 204/192.25 |
| 2014/0102878 | A1 | * | 4/2014 | Zhang | .................... C23C 14/08 204/192.17 |
| 2014/0360863 | A1 | | 12/2014 | Daigo et al. | |

FOREIGN PATENT DOCUMENTS

| CN | 201648508 U | | 11/2010 |
| CN | 102560388 A | | 7/2012 |
| CN | 103173730 A | | 6/2013 |
| CN | 103668095 A | | 3/2014 |
| CN | 104024467 A | | 9/2014 |
| JP | H0711442 A | | 1/1995 |
| JP | 2002302763 A | | 10/2002 |
| JP | 2004277773 A | | 10/2004 |
| JP | 2011-108603 | * | 6/2011 |
| KR | 100270459 B1 | | 12/2000 |
| WO | 2011077653 A1 | | 6/2011 |

OTHER PUBLICATIONS

The World Intellectual Property Organization (WIPO) International Search Report for PCT/CN2016/101565 dated Mar. 15, 2017 5 Pages.

* cited by examiner

DEPOSITION APPARATUS AND PHYSICAL VAPOR DEPOSITION CHAMBER

CROSS-REFERENCES TO RELATED APPLICATIONS

This application is a national phase entry under 35 U.S.C. § 371 of International Application No. PCT/CN2016/101565, filed on Oct. 9, 2016, which claims priority to Chinese Patent Application No. CN201610407585.8, filed on Jun. 12, 2016. The above enumerated patent applications are incorporated by reference herein in their entirety.

FIELD OF THE DISCLOSURE

The present disclosure relates to a semiconductor process apparatus, and particularly relates to a deposition apparatus and a physical vapor deposition chamber.

BACKGROUND

Physical vapor deposition (PVD) such as sputtering process has been widely used in fabrication of today's semiconductor integrated circuits, light emitting diodes (LEDs), solar cells, displays, and so on. In a process chamber of a PVD apparatus, working gas in a reaction chamber is excited into plasma by a high-power direct-current power supply connected to a sputtering target, and ions in the plasma are attracted to bombard the sputtering target, so that the material of the target is sputtered off and deposited on a wafer or other substrate. Different application areas usually have different requirements for sputtering power, sputtering rate and other process parameters, but substantially have a clear striving direction of improving film-formation quality and increasing apparatus capacity.

BRIEF SUMMARY OF THE DISCLOSURE

In order to address the above technical problems, the present disclosure provides a deposition apparatus and a PVD chamber, wherein a heat source that can heat the chamber to 400 degrees Celsius or more is provided in the PVD chamber, thus, the loaded substrate can be preheated, degassed and sputtered in the high temperature environment of the PVD chamber, and as a result, effects of reducing apparatus volume and cost, shortening process time, promoting production capacity and the like can be achieved.

Some embodiments of the present disclosure provide a deposition apparatus, which includes a first chamber, a second chamber and a third chamber. The first chamber is configured to load a substrate. The second chamber is configured to provide a high temperature environment so that a degas process and a sputtering process are performed on the substrate in the second chamber. The third chamber is disposed between the first chamber and the second chamber. The third chamber is configured to directly transfer the substrate from the first chamber to the second chamber via the third chamber.

Some embodiments of the present disclosure provide a PVD chamber, which includes a chamber body, a target, a carrying base and a heat source. The carrying base is provided in the chamber body and configured to carry a substrate. The heat source is provided in the chamber body and configured to heat the chamber body to have a high temperature environment so as to perform a degas process and a sputtering process on the substrate.

The deposition apparatus of the present disclosure includes a first chamber, a second chamber and a third chamber, wherein the third chamber communicates with the first chamber and the second chamber and configured to directly transfer the substrate from the first chamber to the second chamber. The second chamber is configured to perform a degas process and a sputtering process on the substrate, thus omitting an additional preheating/degas chamber and further achieving the effect of reducing apparatus volume and cost.

In the PVD chamber of the present disclosure, a heat source provided in the chamber body may be used to heat the chamber body into a high temperature environment so as to perform a degas process and a sputtering process on the substrate loaded in the chamber body, and thus, it may not be necessary to provide an additional preheating/degas chamber, and an effect of reducing apparatus volume and cost can be further achieved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to the drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure.

Other embodiments of the disclosure will be apparent to those skilled in the art from consideration of the specification and practice of the disclosure provided herein. It is intended that the specification and examples be considered as exemplary only, with a true scope and spirit of the disclosure being indicated by the claims.

In order to make objects, technical solutions and advantages of the present disclosure more clear and explicit, a deposition apparatus and a PVD chamber provided by the present disclosure will be described below in conjunction with the accompanying drawings. It should be understood that specific embodiments described herein are merely used for explaining the present disclosure, rather than limiting the present disclosure.

In the deposition apparatus of the present disclosure, a second chamber is configured to provide a high temperature environment to allow a substrate to undergo a degas process and a sputtering process in the second chamber, so other preheating chamber and/or degas chamber can be omitted, and the effect of reducing apparatus volume and cost can be further achieved.

In the PVD chamber of the present disclosure, a chamber body can be heated to have a high temperature environment by using a heat source provided in the chamber body, so that a degas process and a sputtering process are performed on a substrate loaded into the chamber body, thus there is no need to additionally provide a preheating chamber and/or a degas chamber, and the effect of reducing apparatus volume and cost can be further achieved.

The term "step" as used herein is not limited to a single action, but may include a single action, operation or means, or may be a group consisting of multiple actions, operations and/or means.

Figure 1:
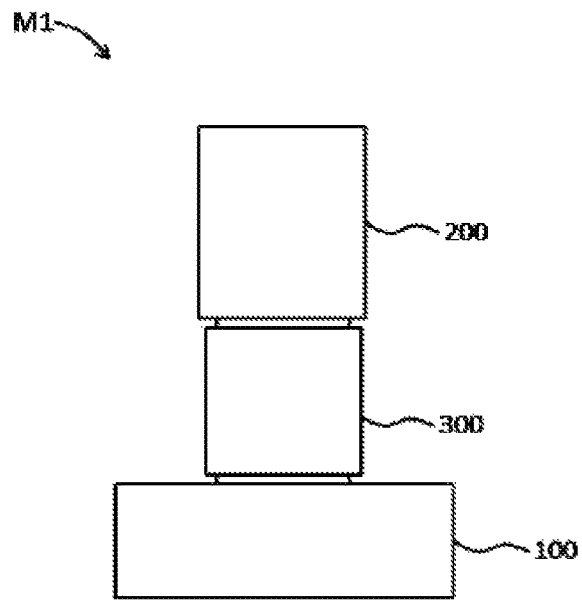
FIG. 1 is a schematic diagram of a deposition apparatus in some embodiments of the present disclosure.
Figure 2:
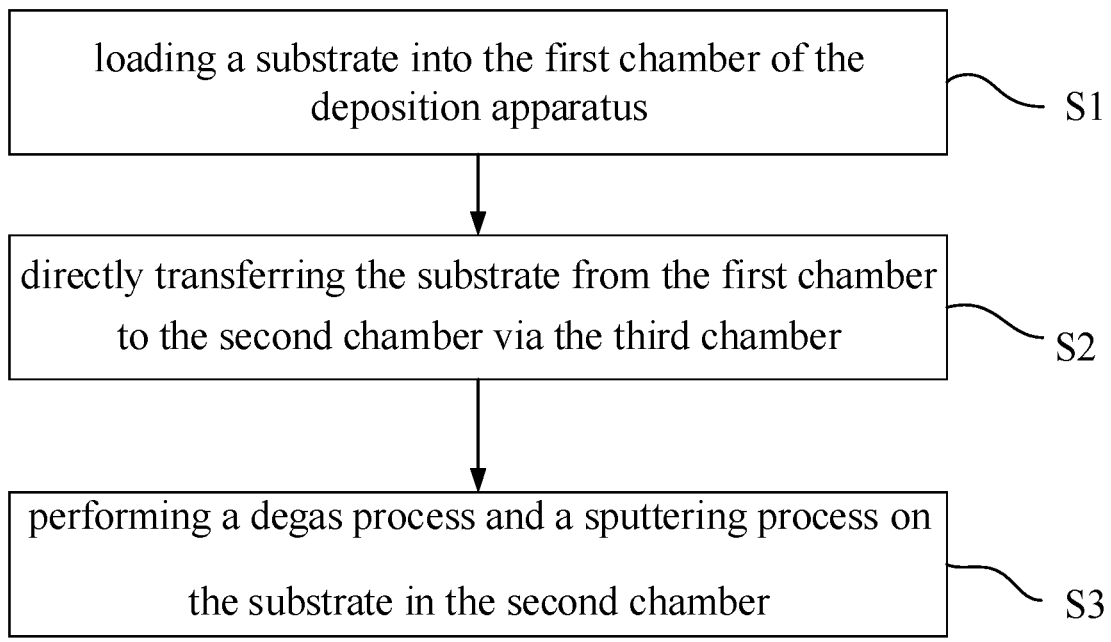
FIG. 2 is a schematic diagram of an operation flow of a deposition apparatus in some embodiments of the present disclosure.

Please refer to FIGS. 1 and 2. FIG. 1 is a schematic diagram of a deposition apparatus in some embodiments of the present disclosure, and FIG. 2 is a schematic diagram of an operation flow of a deposition apparatus in some embodiments of the present disclosure. As shown in FIG. 1, some embodiments of the present disclosure provide a deposition apparatus M1, which includes a first chamber 100, a second chamber 200 and a third chamber 300. The first chamber 100 is configured to load a substrate (not shown in FIGS. 1 and 2), and can thus be considered as a loading/unloading chamber, which is not limited. The second chamber 200 is configured to provide a high temperature environment so that a degas process and a sputtering process are performed on the loaded substrate in the second chamber 200. The third chamber 300 is disposed between the first chamber 100 and the second chamber 200 and is connected to the first chamber 100 and the second chamber 200. The third chamber 300 is configured to directly transfer the substrate from the first chamber 100 to the second chamber 200 via the third chamber 300. The third chamber 300 may be considered as a transfer chamber, which is not limited.

As shown in FIGS. 1 and 2, in some embodiment, the operation flow of the deposition apparatus M1 may include step S1, step S2 and step S3 below. In step S1, a substrate is loaded into the first chamber 100 of the deposition apparatus M1. In step S2, the substrate is directly transferred from the first chamber 100 to the second chamber 200 (i.e., PVD chamber) via the third chamber 300. In step S3, a degas process and a sputtering process are performed on the substrate in the second chamber 200. In some embodiments, the deposition apparatus M1 may further include a heat source (not shown in FIGS. 1 and 2), which is provided in the second chamber 200 and configured to provide the above high temperature environment.

The high temperature environment of the second chamber 200 has a temperature of, for example, 400 degrees Celsius or more, and thus the heat source may be used to heat the substrate and/or the environment in the second chamber 200 before the sputtering process and/or during the sputtering process. When the temperature in the second chamber 200 is heated above a crystallization temperature of a material layer (e.g., aluminum nitride film) to be deposited on a surface of the substrate by the heat source (for example, the temperature in the PVD chamber may be higher than 400 degrees Celsius, or preferably, may be between 400 degrees Celsius and 800 degrees Celsius, or more preferably, may be between 500 degrees Celsius and 700 degrees Celsius), the effect of degassing and/or high-temperature activating the substrate and/or the surface of the substrate can be achieved in the meanwhile. Thus, the second chamber 200 may also be considered as a degas and PVD chamber, which is not limited. In addition, through continuous heating by the heat source in the second chamber 200, temperature condition for performing PVD process can be achieved. And the temperature may be higher than a crystallization temperature of a film formed by sputtering in the PVD process, which has a positive effect on film-formation quality in the PVD process. Furthermore, the above high temperature condition in the PVD chamber also has a positive effect on the target and chamber condition. For example, the above high temperature condition can enlarge crystalline particles of the target and reduce particle related defects.

Moreover, when the PVD chamber is at high temperature, a film on a component of a shielding unit (not shown) thereof is less likely to crack, which also facilitates obviating particle related defects. Precisely speaking, in the PVD chamber of the present embodiment, a pasting process may be performed after a batch of sputtering is performed. The chamber has an environment with a temperature of more than 400 degrees Celsius, so the pasting process may be performed with low power and in a shortened time. Accordingly, the number and frequency of the pasting process can be reduced, which can shorten an overall process time and have a positive effect on life time of the target.

On the contrary, in a well-known PVD chamber, the temperature is lower than 350 degrees Celsius, so crystalline particles of the target are relatively small. It results in the increase of the possibility of occurrence of particle related defects. In that case, a film on a component such as a cover ring, an upper cover, or the like is likely to crack, thus resulting in increasing particle related defects. Therefore, in the well-known PVD chamber, the pasting process needs to be performed with high power and lasts for tens of minutes, and the number and frequency of the pasting process is relatively high. This does not only increase the overall process time but also shorten life time of the target.

Because the degas process and the sputtering process can be performed in the second chamber 200, a degas chamber and/or other heating chamber can be omitted, and the effect of reducing apparatus volume and cost can be further achieved. In addition, the design of the deposition apparatus and the PVD chamber of the present disclosure can simplify fabrication process, and can also avoid relevant defects of the substrate caused by particles dropping on the substrate in the process of transferring the substrate heated in a heating chamber to a sputtering chamber. Furthermore, the above high temperature environment may be preferably higher than 400 degrees Celsius, which effectively allows the substrate to be degassed and/or high-temperature activated. When the PVD process is a high temperature PVD process, the high temperature PVD process can be implemented through continuous heating by the heat source in the second chamber 200.

In other words, the substrate may not need to be preheated and/or degassed in other heating chamber after being loaded into the deposition apparatus M1 and before being subjected to the degas process and the sputtering process in the second chamber 200. In some embodiments, the third chamber 300 may not be connected to any heating chamber other than the second chamber 200. In some embodiments, the deposition apparatus M1 does not include other heating chamber than the second chamber 200 (i.e., the PVD chamber).

Figure 3:
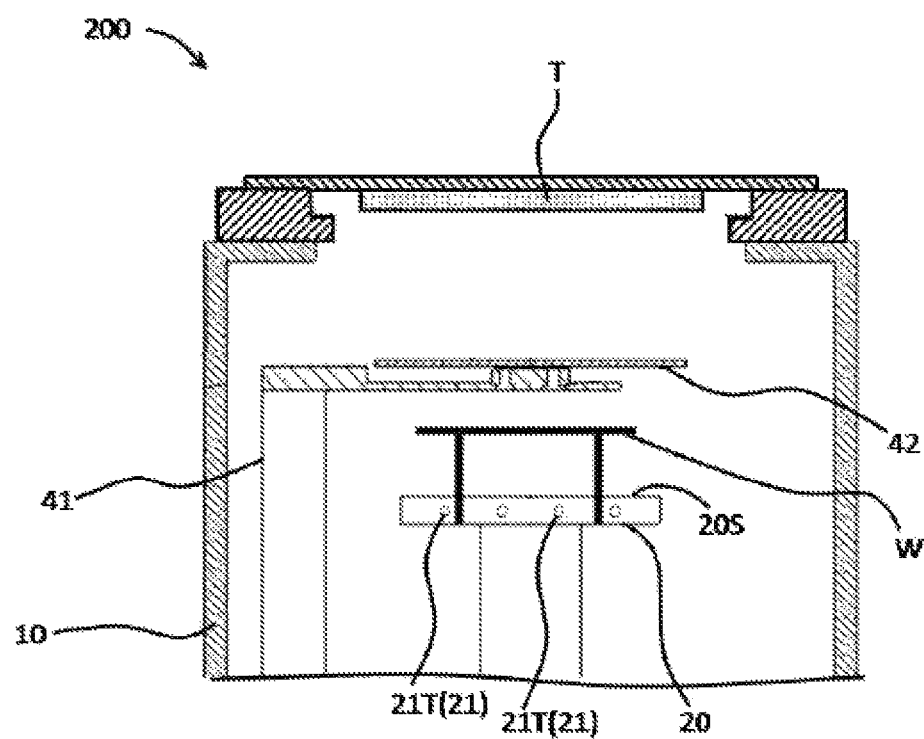
FIG. 3 is a schematic diagram of a physical vapor deposition (PVD) chamber in some embodiments of the present disclosure.
Figure 4:
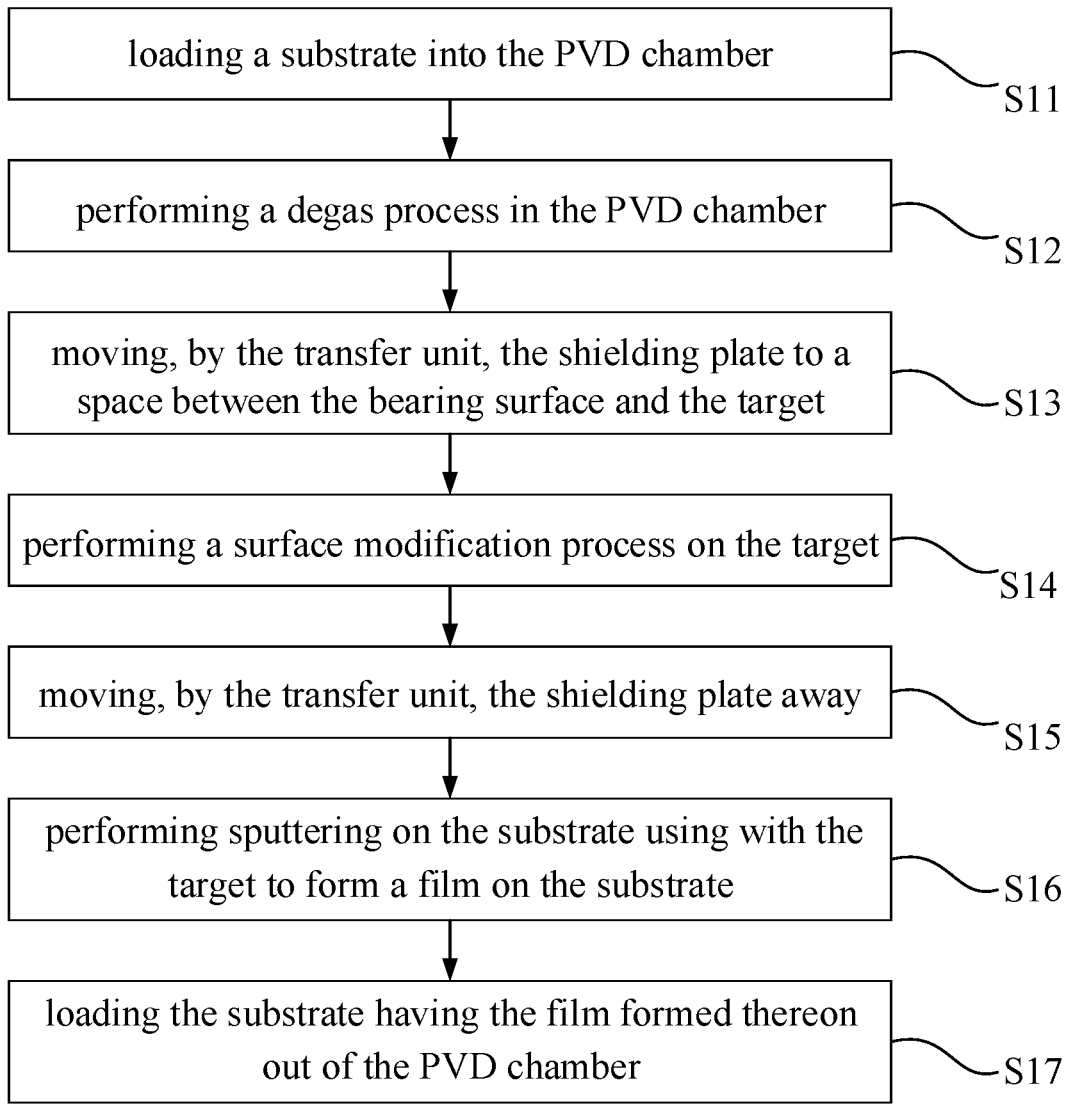
FIG. 4 is a schematic flow chart of a sputtering process performed in a PVD chamber in some embodiments of the present disclosure.

Please refer to FIGS. 3 and 4. FIG. 3 is a schematic diagram of a PVD chamber in some embodiments of the present disclosure, and FIG. 4 is a schematic flow chart of a sputtering process performed in a PVD chamber in some embodiments of the present disclosure. As shown in FIG. 3, in some embodiments, the PVD chamber (i.e., the second chamber 200) includes a chamber body 10, a target T, a carrying base 20 and a heat source 21. The carrying base 20 is configured to maintain a distance from the target T, and the carrying base 20 has a carrying surface 20S facing the target T and used for carrying a substrate W. The heat source 21 is provided in the chamber body 10 and configured to heat the chamber body 10 to 400 degrees Celsius or more (preferably, between 400 degrees Celsius and 800 degrees Celsius, and more preferably, between 500 degrees Celsius and 700 degrees Celsius) so that a degas process and a sputtering process are performed on the substrate W. In some embodiments, the heat source 21 may include a radiant heat source, which may include a plurality of heating lamps 21T, and the substrate W may be disposed between the heat source 21 and the target T, but the present disclosure is not limited thereto.

In some embodiments, the PVD chamber (i.e., the second chamber 200) may include a transfer unit 41 and a shielding plate 42. At least part of the transfer unit 41 is provided in the chamber body 10, the shielding plate 42 is fixed onto the transfer unit 41, the transfer unit 41 is configured to move the shielding plate 42 to a space between the carrying surface 20S and the target T, and the shielding plate 42 is also between the carrying base 20 and the target T. The transfer unit 41 may move the shielding plate 42 to a space between the carrying surface 20S and the target T, for example, in a rotary, translational or other suitable manner, and because the shielding plate 42 is fixed to the transfer unit 41, the shielding plate 42 does not need to be placed on the carrying base 20. Thus, when the shielding plate 42 is between the carrying surface 20S and the target T, the carrying base 20 can also carry thereon the substrate W to be sputtered, and hence, by having the design of the second chamber 200 (i.e., PVD chamber), a surface modification process may be performed on the target T under a condition that the substrate W has been loaded into the PVD chamber, thereby achieving the effect of shortening process time and improving production capacity.

In some embodiments, one or more substrates W may be placed on a tray (not shown) first, and the tray having the substrate(s) W placed thereon is then loaded into the chamber body 10 of the PVD chamber via the above first chamber 100 and third chamber 300 and placed on the carrying base 20. In some other embodiments, the substrate(s) W may be directly placed on the carrying base 20 without the tray. In some embodiments, the substrate W may include a sapphire substrate, silicon carbide (SiC) substrate, or a single material substrate or a composite layer material substrate formed by other suitable material, such as a silicon substrate, a silicon on insulator (SOI) substrate, a glass substrate, or a ceramic substrate, and the shielding plate 42 may be made of a high temperature resistant material such as silicon carbide (SiC), molybdenum, or the like, which are not limited. Furthermore, the chamber body 10 and components in the chamber body 10 are preferably made of metal molybdenum, low carbon stainless steel, quartz or other high temperature resistant metal or nonmetallic material, so that the above high temperature environment can be formed or other high temperature process can be performed in the chamber body 10 without any qualitative change or deformation.

As shown in FIGS. 3 and 4, in some embodiments, the sputtering process SR performed in the PVD chamber (i.e., the second chamber 200) may include step S11, step S12, step S13, step S14, step S15, step S16 and step S17 below. In step S11, the substrate W is loaded into the PVD chamber. In step S12, a degas process is performed in the PVD chamber. The degas process may be implemented by using the heat source 21 to heat the chamber body 10 to form a high temperature environment, which can result in an effect of degassing and/or activating the substrate W. Thus, the high temperature environment may be preferably higher than a crystallization temperature of a material layer (e.g., aluminum nitride film) to be deposited on a surface of the substrate (for example, the temperature in the PVD chamber may be higher than 400 degrees Celsius, or preferably, may be between 400 degrees Celsius and 800 degrees Celsius, which is not limited).

Subsequently, in step S13, the transfer unit 41 is used to move the shielding plate 42 to a space between the carrying surface 20S and the target T. In step S14, a surface modification process is performed on the target. In step S15, the transfer unit 41 is used to move the shielding plate 42 away. In step S16, sputtering is performed on the substrate W using the target T in the chamber body 10 to form a film on the substrate W. In step S17, the substrate W having the film formed thereon is carried out of the PVD chamber. Although the substrate W has been loaded into the chamber body 10 when the surface modification process is performed on the target T, the shielding plate 42 between the carrying surface 20S and the target T can avoid the material of the target T from forming on the substrate W. In other words, through the above sputtering process SR, it may not be necessary to open the chamber body 10 to load the substrate W after the surface modification process is performed on the target T, which facilitates stabilizing the process conditions of the substrate W during the sputtering, can also omit the operation, that takes time to perform, of stabilizing the chamber body 10 due to the loading of the substrate W, and further shortens the overall time of the sputtering process SR and achieves an effect of improving production capacity.

In some embodiments, the action of forming the high temperature environment in the chamber body 10 by the heat source 21 may be regarded as a heating process, and at least part of the heating process may be performed simultaneously with the surface modification process of the target T, thus achieving the effect of shortening the overall process time. In addition, when the PVD process is a high temperature PVD process, the heat source 21 in the second chamber 200 may be used to heat continuously to implement the high temperature PVD process. The heat source 21 may be provided within the chamber body 10 and heat the second chamber 200 to 400 degrees Celsius or more, so the heat source 21 may be configured to control the temperature in the chamber body 10. For example, when performing the above heating process and/or PVD process, the heat source 21 may be used to heat the chamber body 10 and/or the substrate W to achieve the degas effect and/or reach the process temperature required for the PCV process.

The above sputtering process SR performed in the PVD chamber is illustrative only, but the present disclosure is not limited thereto, other additional step that is required may be performed before, after and/or in the sputtering process SR, and the steps in the sputtering process SR may be replaced, omitted, or changed in sequence in other embodiments.

In some embodiments, the above deposition apparatus and PVD chamber may be used to form a non-metallic film, a metal film or a metal compound film such as an aluminum nitride (AlN) film, which is not limited. In other words, the second chamber 200 may be an aluminum nitride PVD chamber and configured to form an aluminum nitride film on the substrate W.

Hereinafter, difference embodiments of the present disclosure will be described. For simplicity, differences between the embodiments will be mainly described in detail below, and similarities will not be repeated. Furthermore, in the embodiments of the present disclosure, a same component is denoted by a same reference numeral to facilitate comparison between the embodiments.

Figure 5:
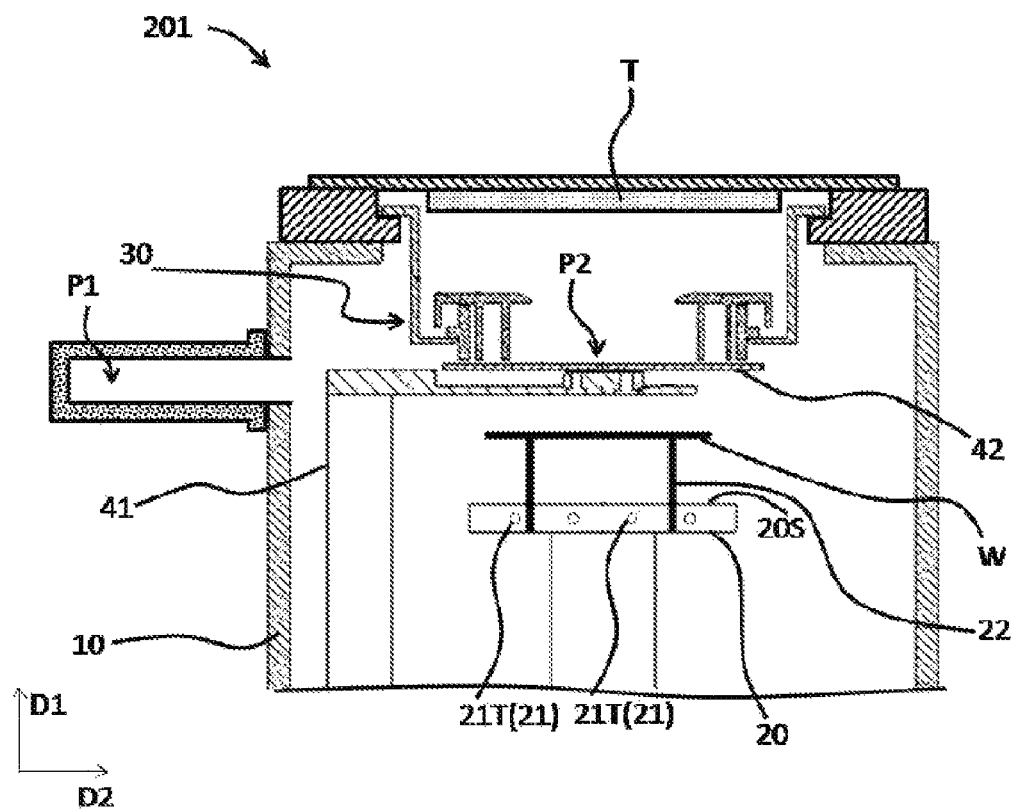
FIG. 5 is a schematic diagram of a PVD chamber in some embodiments of the present disclosure.

Please refer to FIG. 5. FIG. 5 is a schematic diagram of a PVD chamber in some embodiments of the present disclosure. As shown in FIG. 5, in some embodiments, the PVD chamber 201 may further include a shielding unit 30 provided in the chamber body 10 and between the target T and the carrying base 20. When the shielding plate 42 moves to a space between the carrying surface 20S and the target T, the shielding plate 42 is also between the carrying base 20 and the shielding unit 30. The carrying base 20 and the shielding unit 30 may be provided correspondingly in a first direction D1, which may be considered as a vertical direction, but the present disclosure is not limited thereto. The shielding unit 30 is provided between the carrying base 20 and the target T in the first direction D1. The shielding plate 42 is fixed to the transfer unit 41, the transfer unit 41 is configured to move the shielding plate 42 between a temporary position P1 and a shielding position P2 in a second direction D2, and the shielding plate 42 is between the carrying surface 20S and the target T and between the carrying surface 20S and the shielding unit 30 when being moved to the shielding position P2. The second direction D1 may be considered as a horizontal direction, which is not limited. The transfer unit 41 may move the shielding plate 42 to a space between the carrying surface 20S and the target T, for example, in a rotary, translational or other suitable manner, i.e., move the shielding plate 42 between the temporary position P1 and the shielding position P2 in the second direction D2, which is not limited. Furthermore, because the shielding plate 42 is fixed to the transfer unit 41, the shielding plate 42 does not need to be placed on the carrying base 20. In addition, the PVD chamber 201 may further include a plurality of ejector pins 22 provided on the carrying base 20 and configured to lift the substrate W from the surface of the carrying base 20. In some embodiments, the ejector pins 22 may include temperature measuring ejector pins used for detecting a temperature in the chamber body 10 and/or a temperature of the substrate W, which is not limited.

In some embodiments, the shielding plate 42 may have an adhesive surface, at least part of which faces the target T, and the adhesive surface may include a rough surface or an adhesive surface formed by an appropriate surface treatment such as sandblasting, melting, surface roughening or the like to increase bonding capacity between the shielding plate 42 and material of the target T, further enable an upper surface of the shielding plate 42 to adsorb more material falling from target T, and achieve the effect of enhancing the shielding effect of the shielding plate 42.

Figure 6A:
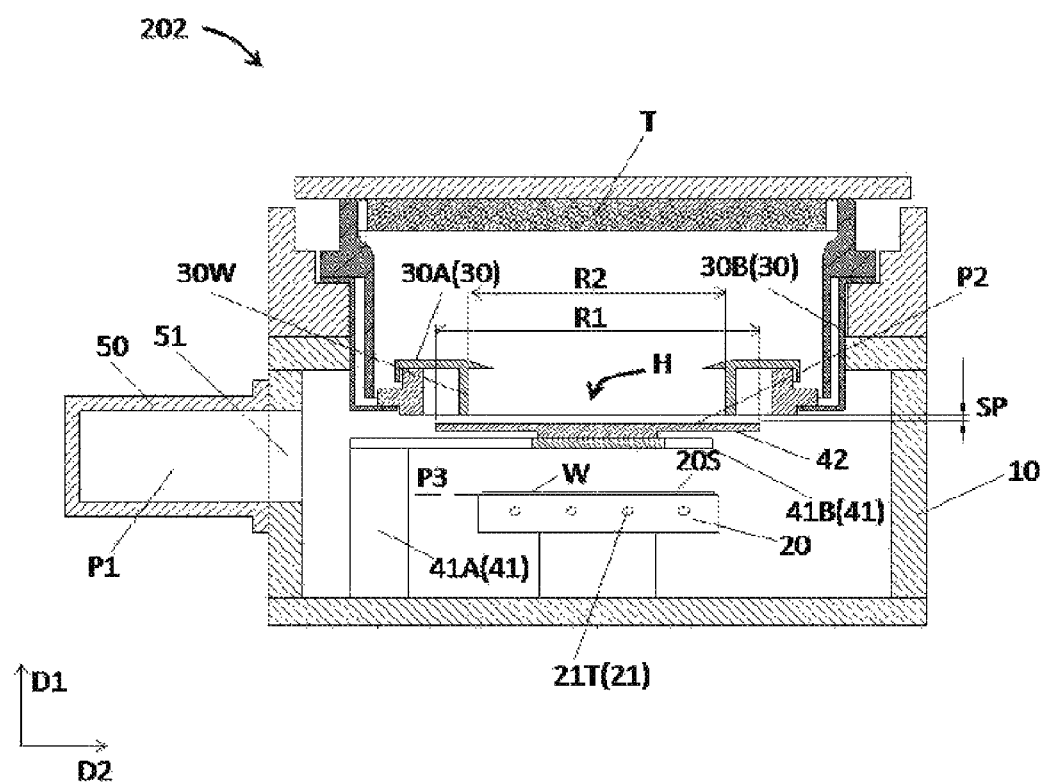
FIG. 6A is a schematic status diagram of a sputtering process performed in a PVD chamber in some embodiments of the present disclosure.
Figure 6B:
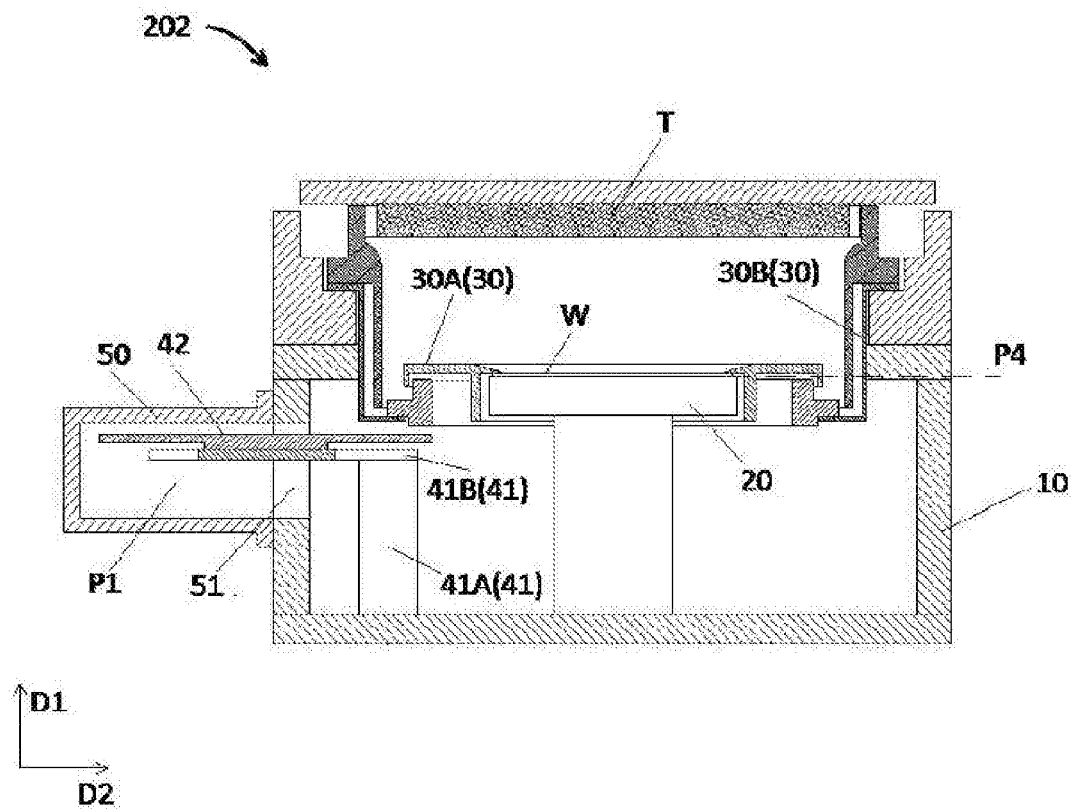
FIG. 6B is a schematic status diagram of a sputtering process performed in a PVD chamber in some embodiments of the present disclosure.
Figure 7:
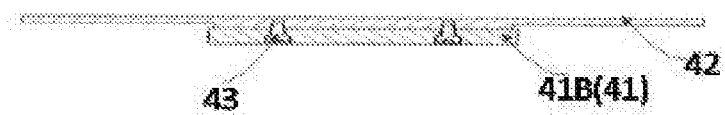
FIG. 7 is a schematic diagram of connection status between a shielding plate and a transfer unit in some embodiments of the present disclosure.

Please refer to FIGS. 6A, 6B and 7. FIGS. 6A and 6B are schematic status diagrams of a sputtering process performed in a PVD chamber in some embodiments of the present disclosure, and FIG. 7 is a schematic diagram of connection status between a shielding plate and a transfer unit in some embodiments of the present disclosure. As shown in FIG. 6A, the shielding plate 42 may be moved to the space between the carrying surface 20S and the target T, or may be transferred to the shielding position P2 above the substrate W, by using the transfer unit 41; alternatively, as shown in FIG. 6B, the shielding plate 42 is moved to the temporary position P1 formed by a shielding plate depository 50 through a port 51 by using the transfer unit 41. In some embodiments, sealing treatment may be performed between the shielding plate depository 50 and the chamber body 10; considering vacuum integrity between the shielding plate depository 50 and the chamber body 10, the shielding plate depository 50 and the chamber body 10 may be connected through welding or formed integrally. The transfer unit 41 may move the shielding plate 42 to the space between the carrying surface 20S and the target T in a rotary or other suitable manner, or move the shielding plate 42 between the temporary position P1 and the shielding position P2 in the second direction D2. For example, the structure of the transfer unit 41 may include a rotary axis 41A and a support plate 41B, the shielding plate 42 may be fixed to an upper surface of the support plate 41B, and the rotary axis 41A is connected to the support plate 41B. By using a drive source to provide rotational power, the rotary axis 41A may drive the support plate 41B to rotate clockwise or counter-clockwise by a preset angle, to move the shielding plate 42 to the shielding position P2 or the temporary position P1. Furthermore, as shown in FIG. 7, the shielding plate 42 may be fixed to the transfer unit 41 through a fixing component 43. The fixing component 43 may include a screw, a rivet, an adhesive material, or other suitable fixing component, and is used for fixing the shielding plate 42 to the support plate 41B of the transfer unit 41. In other embodiments of the present disclosure, other detachable manner or undetachable manner (e.g., welding) may be adopted to fix the shielding plate 42 to the transfer unit 41.

As shown in FIG. 6A, when the shielding plate 42 is moved to the shielding position P2, the shielding plate 42 is between the shielding unit 30 and the substrate W, the substrate W on the carrying base 20 may descend to a loading and unloading position P3 with the aid of the carrying base 20, at this point, the target T may be cleaned, and the chamber body 10 and/or the substrate W may be heated using the heat source 21 at the same time. In some embodiments, the shielding unit 30 has an opening H, and an area of the shielding plate 42 (e.g., a projected area of the shielding plate 42 in the first direction D1) is larger than that of the opening H of the shielding unit 30, so as to ensure the shielding effect of the shielding plate 42. For example, in some embodiments, the shielding unit 30 may include a shielding ring 30A and an annular housing 30B for supporting the shielding ring 30A, and an internal surface 30W of one end of the shielding ring 30A proximal to the carrying surface 20S defines the opening H, which is not limited. When the shielding plate 42 is moved to the shielding position P2 (between the carrying surface 20S and the shielding unit 30), there is a spacing distance SP between the shielding plate 42 and the shielding unit 30 in the first direction D1, to ensure that the shielding plate 42 can be smoothly moved in the second direction D2 and target material sputtered off the target T cannot be sputtered to the substrate W through the gap between the shielding unit 30 and the shielding plate 42. For example, the spacing distance SP may be between 2 mm and 4 mm, which is not limited. In some embodiments, an outer diameter R1 of the shielding plate 42 is preferably larger than an inner diameter R2 of the shielding ring 30A, so as to ensure that material of the target T can only be sputtered towards a side wall of the chamber body 10 but not onto the substrate W even if it has passed through the gap between the shielding ring 30A and the shielding plate 42. Further, the above inner diameter R2 may be considered as a diameter of the opening H, and the outer diameter R1 of the shielding plate 42 may be preferably larger than the inner diameter R2 of the shielding ring 30A by 20 mm to 30 mm, which is not limited.

As shown in FIG. 6B, when the shielding plate 42 is moved to the temporary position P1, the substrate W on the carrying base 20 may rise to a process position P4 with the aid of the carrying base 20, at this point, the shielding ring 30A may be held up from the annular housing 30B so that the shielding ring 30A presses, under its own gravity, against an edge portion of the substrate W to sputter the substrate W using the target T. When the shielding plate 42 is at the temporary position P1, a portion of the shielding plate 42 is moved into a space contained by the shielding plate depository 50 via the port 51, and the remaining portion of the shielding plate 42 is shifted towards a peripheral direction of the chamber body 10 until it is out of a rising path of the substrate W and the carrying base 20, thus ensuring that the substrate W can rise to the process position P4 smoothly.

Figure 8A:
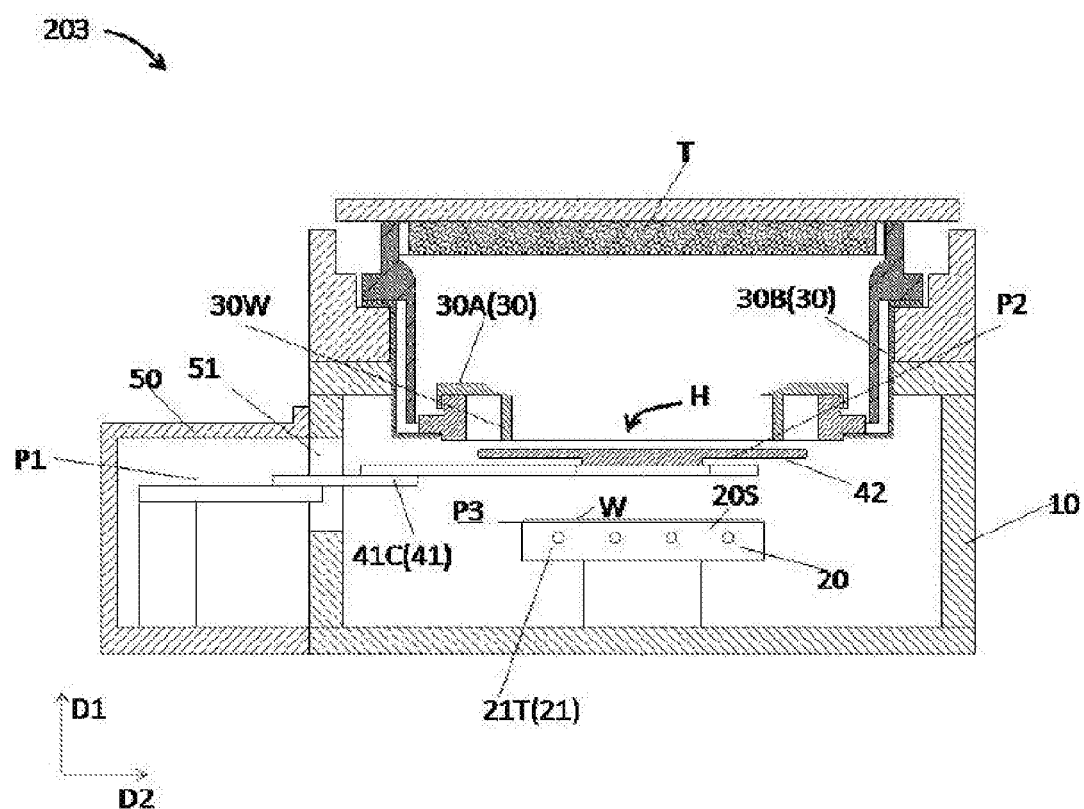
FIG. 8A is a schematic status diagram of a sputtering process performed in a PVD chamber in some embodiments of the present disclosure.
Figure 8B:
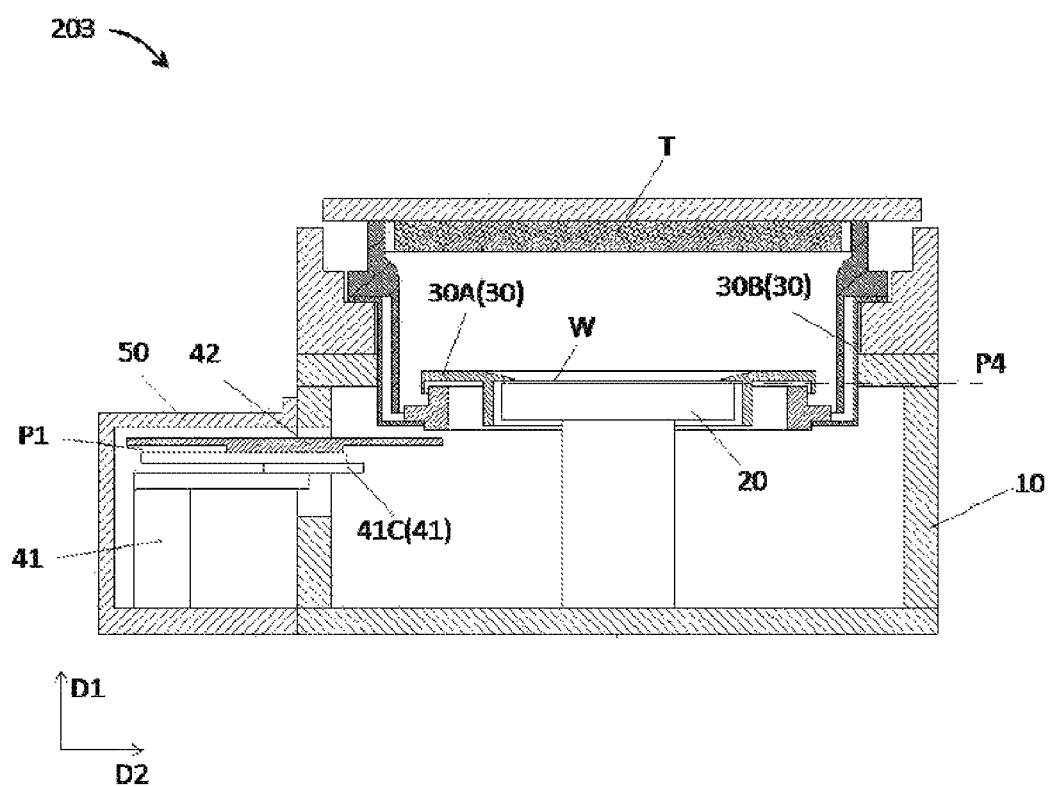
FIG. 8B is a schematic status diagram of a sputtering process performed in a PVD chamber in some embodiments of the present disclosure.

Please refer to FIGS. 8A and 8B. FIGS. 8A and 8B are schematic status diagrams of a sputtering process performed in a PVD chamber in some embodiments of the present disclosure. As shown in FIG. 8A, the shielding plate 42 may be moved to the space between the carrying surface 20S and the target T, in other words, transferred to the shielding position P2 above the substrate W, by using the transfer unit 41; or, as shown in FIG. 8B, the shielding plate 42 may be moved to the temporary position P1 formed by the shielding plate depository 50 via the port 5 by using the transfer unit 41. As shown in FIGS. 8A and 8B, in some embodiments, the transfer unit 41 may move the shielding plate 42 to the space between the carrying surface 20S and the target T in a transitional manner, in other words, move the shielding plate 42 between the temporary position P1 and the shielding position P2 in the second direction D2. For example, the transfer unit 41 may include a mechanical arm 41C used for carrying the shielding plate 42 and provided in the space formed by the shielding plate depository 50, and the mechanical arm 41C may stretch into the interior of the chamber body 10 via the port 51, or is retracted into the space formed by the shielding plate depository 50 from the interior of the chamber body 10, thus moving the shielding plate 42 to the shielding position P2 or the temporary position P1. For example, the mechanical arm 41C may be formed by a plurality of connected cantilevers, which achieve horizontal telescopic action in the second direction D2 through folding or unfolding, but the present disclosure is not limited thereto. Other mechanical arm having other configuration or other structure that can be used to achieve horizontal telescopic action in the second direction D2 should be encompassed in the scope of the present disclosure.

Figure 9:
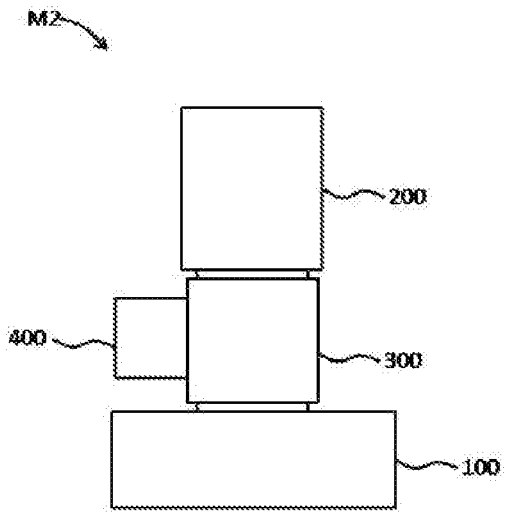
FIG. 9 is a schematic diagram of a deposition apparatus in some embodiments of the present disclosure.
Figure 10:
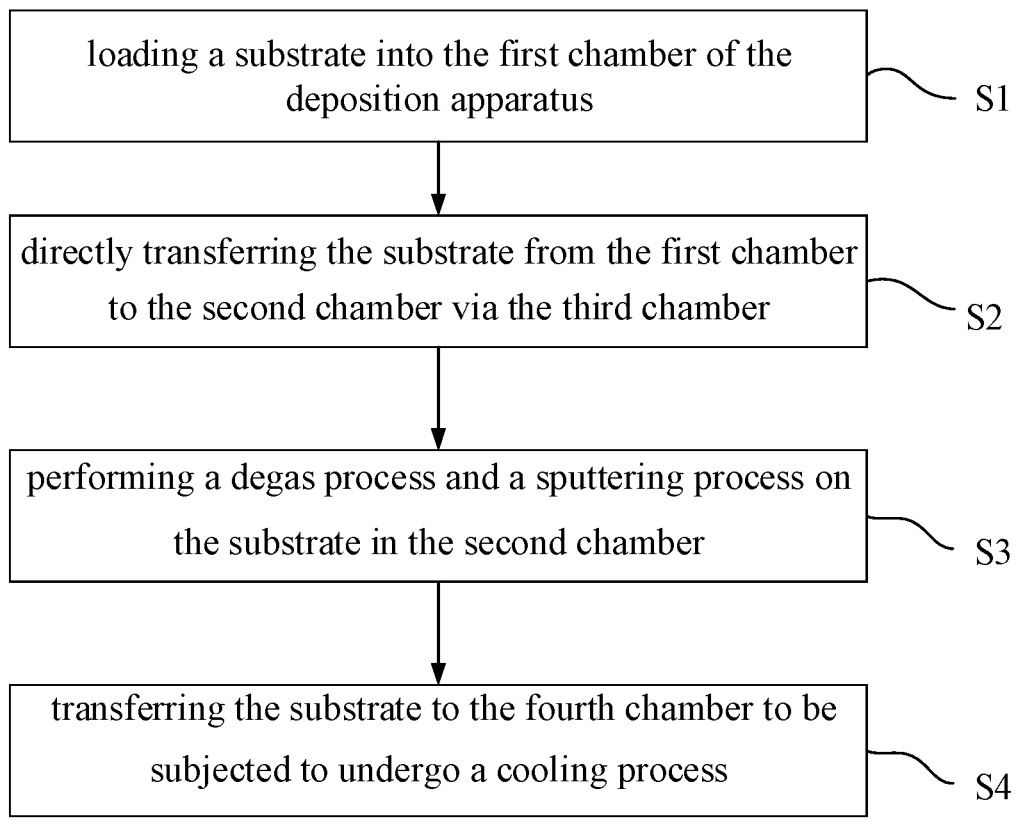
FIG. 10 is a schematic diagram of an operation flow of a deposition apparatus in some embodiments of the present disclosure.

Please refer to FIGS. 9 and 10. FIG. 9 is a schematic diagram of a deposition apparatus in some embodiments of the present disclosure, and FIG. 10 is a schematic diagram of an operation flow of a deposition apparatus in some embodiments of the present disclosure. As shown in FIG. 9, some embodiments of the present disclosure provide a deposition apparatus M2, which differs from the above deposition apparatus M1 shown in FIG. 1 in that the deposition apparatus M2 further includes a fourth chamber 400 connected to the third chamber 300 and configured to perform a cooling process in which the cooling operation is performed on the substrate having been subjected to the degas process and the sputtering process in the second chamber 200. For example, in some embodiments, the operation flow of the deposition apparatus M2 may include step S1, step S2, step S3 and step S4 shown in FIG. 10. In step S1, the substrate is loaded into the first chamber 100 of the deposition apparatus M2. In step S2, the substrate is directly transferred from the first chamber 100 to the second chamber 200 via the third chamber 300. In step S3, a degas process and a sputtering process are performed on the substrate in the second chamber 200. In step S4, the substrate having been subjected to the degas process and the sputtering process is carried out of the second chamber 200, and transferred to the fourth chamber 400 via the third chamber 300 to undergo the cooling process. Further, after the temperature of the substrate is lowered to a predetermined temperature in the fourth chamber 400, the substrate may be taken out of the fourth chamber 400 and then carried out of the deposition apparatus M2 sequentially via the third chamber 300 and the first chamber 100.

From the above, in the deposition apparatus of the present disclosure, the PVD chamber is configured to heat the chamber body into a high temperature environment, so the degas process and the sputtering process can be performed on the substrate in the PVD chamber. In addition, with the transfer chamber, the substrate may be directly transferred from the loading/unloading chamber to the PVD chamber to perform the degas process and the sputtering process on the substrate, thereby omitting a preheating/degas chamber and achieving the effect of reducing apparatus volume and cost. Furthermore, with the deposition apparatus of the present disclosure, fabrication process can be simplified, and the problem that particles may fall on the substrate in the process of transferring the substrate heated in other heating chamber to the PVD chamber may be avoided. In the PVD chamber of the present disclosure, a heat source may be provided in the chamber body to heat the chamber body into a high temperature environment for performing the degas process and the sputtering process on the substrate loaded into the chamber body. Moreover, the shielding plate is fixed to the transfer unit, and the transfer unit moves the shielding plate to the space between the carrying surface of the carrying base and the target, so that the carrying base can still carry thereon the substrate to be sputtered when the shielding plate is at the shielding position, and in this way, the target can be cleaned under the condition that the substrate has been loaded, and the effect of shortening process time and improving production capacity can be further achieved. Furthermore, when cleaning the target, the substrate below the shielding plate can undergo the heating process at the same time, thus degassing and/or high-temperature activating the substrate, shortening the overall process time and promoting the production capacity.

The foregoing summarizes features of some embodiments, so that those skilled in the art can understand respective aspects of the disclosure of the present application. Those skilled in the art should understand that other process and structure may be easily designed or modified on the basis of the disclosure of the present application to achieve the same object and/or the same advantage as those described in the embodiments of the present application. Those skilled in the art should also understand that these architectures do not depart from the spirit and scope of the disclosure of the present application, and can make various changes, displacements and replacements without departing from the spirit and scope of the disclosure of the present application.

What is claimed is:

1. A deposition apparatus, comprising:
   a first chamber, configured to load in a substrate;
   a second chamber, including a chamber body, a target, a carrying base configured to carry the substrate, a heat source configured to heat the second chamber, a transfer unit, a shielding plate fixed to the transfer unit, and a shielding unit including a shielding ring and an inner surface extended from one end of the shielding ring toward the carrying base; and
   a third chamber, disposed between the first chamber and the second chamber, the third chamber being configured as a transfer chamber and the substrate being transferred from the first chamber to the second chamber via the third chamber,
   wherein:
      the second chamber is an only chamber equipped with a heat source in the deposition apparatus,
      in response to the substrate being loaded in the second chamber, the substrate is maintained in the second chamber during each of a degassing and/or activating process on the substrate, a surface modification process on the target, and a physical vapor deposition (PVD) process on the substrate under heat provided by the heat source,
      in a first phase, the second chamber is performing the degassing and/or activating process on the substrate at a first temperature to avoid particles on the substrate,
      in a second phase, the substrate remains on the carrying base in the second chamber, the heat source is increasing an environment temperature of the second chamber to a second temperature higher than the first temperature, the substrate on the carrying base is lowered to a loading/unloading position, the shielding plate is arranged in a space between the carrying base and the target, and the second chamber is performing the surface modification process on the target and simultaneously, the substrate on the carrying base is heated by the heat source, and
      in a third phase, the heat source is increasing the environment temperature of the second chamber to a third temperature higher than the second temperature, the shielding plate is moved away from the space between the carrying base and the target, the substrate on the carrying base is lifted to a process position above the shielding plate, and the second chamber is performing the physical vapor deposition (PVD) process on the substrate at the third temperature, thereby omitting a preheating/degas chamber and achieving an effect of reducing apparatus volume and cost.

2. The deposition apparatus according to claim 1, wherein: the heat source is configured to provide a high temperature environment to the second chamber, the high temperature environment including a temperature no less than 400 degrees Celsius.

3. The deposition apparatus according to claim 1, further comprising a fourth chamber connected to the third chamber and configured to perform a cooling process.

4. The deposition apparatus according to claim 1, wherein: the transfer unit is configured to move the shielding plate to the space between the carrying base and the target in a rotary manner.

5. The deposition apparatus according to claim 1, wherein: the transfer unit is configured to move the shielding plate to the space between the carrying base and the target in a translational manner.

6. The deposition apparatus according to claim 1, wherein: the shielding plate is between the carrying base and the shielding unit when the shielding plate is moved to the space between the carrying base and the target.

7. The deposition apparatus according to claim 6, wherein: a spacing distance is maintained between the shielding plate and the shielding unit when the shielding plate is moved between the carrying base and the shielding unit.

8. The deposition apparatus according to claim 7, wherein: the spacing distance is between 2 mm and 4 mm.

9. The deposition apparatus according to claim 6, wherein: an area of the shielding plate is larger than an area of an opening of the shielding unit, the opening being defined by the inner surface of the shielding unit.

10. The deposition apparatus according to claim 9, wherein: an outer diameter of the shielding plate is larger than an inner diameter of the shielding ring by 20 mm to 30 mm.

11. The deposition apparatus according to claim 1, wherein: the shielding plate is fixed to the transfer unit through a fixing component.

12. The deposition apparatus according to claim 1, wherein: the deposition apparatus is an aluminum nitride film sputtering apparatus.

13. A physical vapor deposition (PVD) chamber, comprising:
   a chamber body;
   a target;
   a carrying base, provided in the chamber body and configured to carry a substrate; and
   a heat source, provided in the chamber body and configured to heat the chamber body;
   a transfer unit;
   a shielding plate, fixed to the transfer unit; and
   a shielding unit, including a shielding ring and an inner surface extended from one end of the shielding ring toward the carrying base;
   wherein:
      the PVD chamber is connected to a loading/unloading chamber and a transfer chamber, and the PVD chamber is an only chamber that is equipped with a heat source and connected to the transfer chamber,
      in response to the substrate being loaded in the PVD chamber, the substrate is maintained in the PVD chamber during each of a degassing and/or activating process on the substrate, a surface modification process on the target, and a physical vapor deposition (PVD) process on the substrate under heat provided by the heat source, in a first phase, the PVD chamber is performing the degassing and/or activating process on the substrate at a first temperature to avoid particles on the substrate, in a second phase, the substrate remains on the carrying base in the PVD chamber, the heat source is increasing an environment temperature of the PVD chamber to a second temperature higher than the first temperature, the substrate on the carrying base is lowered to a loading/unloading position, the shielding plate is arranged in a space between the carrying base and the target, and the PVD chamber is performing the surface modification process on the target and simultaneously, the substrate on the carrying base is heated by the heat source, and in a third phase, the heat source is increasing the environment temperature of the PVD chamber to a third temperature higher than the second temperature, the shielding plate is moved away from the space between the carrying base and the target, the substrate on the carrying base is lifted to a process position above the shielding plate, and the PVD chamber is performing the physical vapor deposition process on the substrate at the third temperature, thereby omitting a preheating/degas chamber and achieving an effect of reducing apparatus volume and cost.

14. The PVD chamber according to claim 13, wherein: the heat source is configured to provide a high temperature environment to the PVD chamber, the high temperature environment including a temperature no less than 400 degrees Celsius.

15. The PVD chamber according to claim 13, wherein: the heat source comprises a radiant heat source.

16. The PVD chamber according to claim 15, wherein: the radiant heat source comprises a plurality of heating lamps.

17. The PVD chamber according to claim 13, wherein: the substrate is between the heat source and the target when the substrate is loaded on the carrying base.

18. The PVD chamber according to claim 13, wherein: the PVD chamber is an aluminum nitride PVD chamber and configured to form an aluminum nitride film on the substrate.

19. The deposition apparatus according to claim 1, wherein the shielding plate includes an adhesive surface facing the target.

20. The PVD chamber according to claim 13, wherein the shielding plate includes an adhesive surface facing the target.

* * * * *